United States Patent
Hu et al.

(10) Patent No.: US 10,938,307 B2
(45) Date of Patent: Mar. 2, 2021

(54) INPUT POWER LIMITED SWITCHING REGULATOR

(71) Applicant: Apple Inc., Cupertino, CA (US)

(72) Inventors: Yongxuan Hu, San Jose, CA (US);
Weiyun Chen, Los Gatos, CA (US);
Stephen C. Terry, San Jose, CA (US);
Chi Kin Ho, Milpitas, CA (US); Norah E. Nakibuuka, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/121,205

(22) Filed: Sep. 4, 2018

(65) Prior Publication Data

US 2019/0074764 A1 Mar. 7, 2019

Related U.S. Application Data

(60) Provisional application No. 62/554,704, filed on Sep. 6, 2017.

(51) Int. Cl.
| | |
|---|---|
| *H02M 3/158* | (2006.01) |
| *H03G 3/20* | (2006.01) |
| *H02M 3/156* | (2006.01) |
| *H03F 3/45* | (2006.01) |
| *H02M 1/00* | (2006.01) |
| *H03G 11/00* | (2006.01) |

(52) U.S. Cl.
CPC ........... *H02M 3/158* (2013.01); *H02M 3/156* (2013.01); *H03G 3/20* (2013.01); *H02M 2001/0019* (2013.01); *H02M 2001/0025* (2013.01); *H03F 3/45* (2013.01); *H03G 11/00* (2013.01)

(58) Field of Classification Search
CPC ................. H02M 3/158; H02M 3/156; H02M 2001/0019; H02M 2001/0025; H03G 3/20; H03G 11/00; H03F 3/45
See application file for complete search history.

(56) References Cited

U.S. PATENT DOCUMENTS

| | | | | |
|---|---|---|---|---|
| 6,300,723 | B1 * | 10/2001 | Wang | H02M 1/4225 315/247 |
| 2005/0010826 | A1 * | 1/2005 | Pullen | H02M 3/156 713/300 |
| 2005/0206354 | A1 * | 9/2005 | Ikezawa | H02M 3/1582 323/248 |
| 2008/0007222 | A1 * | 1/2008 | Nance | G01R 31/3647 320/128 |
| 2010/0270995 | A1 * | 10/2010 | Laur | H02M 3/156 323/285 |

(Continued)

*Primary Examiner* — Jue Zhang
*Assistant Examiner* — Trinh Q Dang
(74) *Attorney, Agent, or Firm* — Blank Rome LLP

(57) ABSTRACT

This disclosure describes a system and a method to limit (i.e., regulate) the input power of a power converter as a function of the voltage and/or loading condition of a power-limited source such as a battery. In some embodiments, the power converter may comprise a transconductance amplifier that may produce a sink current to a current mirror, which in turn that may provide an adjusted current limit threshold to the power converter. The power converter may utilize the current limit threshold to perform cycle-by-cycle current limiting, thus regulating the input power drawn from the battery.

23 Claims, 3 Drawing Sheets

(56) References Cited

U.S. PATENT DOCUMENTS

| | | | |
|---|---|---|---|
| 2012/0268094 A1* | 10/2012 | Scaldaferri | H02M 3/156 |
| | | | 323/284 |
| 2016/0026204 A1* | 1/2016 | de Cremoux | G05F 3/08 |
| | | | 323/314 |
| 2017/0373596 A1* | 12/2017 | Huang | H02M 3/158 |
| 2018/0160516 A1* | 6/2018 | Kwak | H05B 41/282 |

* cited by examiner

INPUT POWER LIMITED SWITCHING REGULATOR

TECHNICAL FIELD

This disclosure relates generally to the field of power conversion and, in particular, to input power limitation of power converters.

BACKGROUND

Most of today's mobile systems are powered by power-limited sources, for example, lithium-ion batteries, because of their lightweight and high power density. A mobile system may use one or more power converters to draw power from a battery, process and then deliver the power to subsystem(s) of the mobile system. During operation, the battery may face load transients, for example, fast load increases caused by processors, RF power amplifiers, audio amplifiers, and/or other subsystems of the mobile system. Such fast load transients may cause a sag of the battery terminal voltage. The voltage sag may become even more severe for an aged and/or cold battery, even at high state-of-charge (SOC), because of the increased internal impedance of the battery after long-time usage and/or because of cold temperature. The voltage sag of the battery may negatively affect normal operation of the mobile system. At an extreme condition, it may cause a shutdown of the subsystem(s) and/or even the mobile system itself. Thus, what is needed is a solution to limit (i.e., regulate) the input power of a power converter that is drawn from a battery as a function of the voltage and/or loading condition of the battery.

SUMMARY

This disclosure describes a system and method to limit (i.e., regulate) the input power of a power converter as a function of the voltage and/or loading condition of a power-limited source such as a battery. In some embodiments, the power converter may comprise a hardware-based system with low latency to limit the input power of the power converter. In some embodiments, the hardware-based system may comprise a closed-loop control based on, for example, a transconductance amplifier that may produce a sink current related to a difference between the battery voltage and a reference voltage. In some embodiments, the transconductance amplifier may include a programmable gain, which may be predetermined and/or adjusted during operation responsive to the voltage and/or loading condition of the battery. In some embodiments, the reference voltage may also be predetermined and/or adjusted based on the battery's type, age, and/or temperature. In some embodiments, the hardware-based system may comprise one or more current mirrors that may adjust a current limit threshold to the power converter, based on the sink current from the transconductance amplifier. In some embodiments, the power converter may utilize the current limit threshold to perform cycle-by-cycle current limiting, thus regulating the input power drawn by the power converter. In some embodiments, the power converter may be a buck converter, a boost converter, and/or a buck-boost converter.

BRIEF DESCRIPTION OF THE DRAWINGS

Various embodiments of the disclosed concepts are illustrated by way of example and not by way of limitation in the accompanying drawings in which like references indicate similar elements. It should be noted that references to "an", "one" or "another" embodiment in this disclosure are not necessarily to the same or different embodiment, and they mean at least one. In order to be concise, a given figure may be used to illustrate the features of more than one embodiment, or more than one species of the disclosure, and not all elements in the figure may be required for a given embodiment or species. Additionally, features from multiple figures may be combined into some embodiments.

DETAILED DESCRIPTION

In the following description, for purposes of explanation, numerous specific details are set forth to provide a thorough understanding of the disclosed concepts. As part of this description, some of this disclosure's drawings represent structures and devices in block diagram form in order to avoid obscuring the disclosure. In the interest of clarity, not all features of an actual implementation are described in this disclosure. Moreover, the language used in this disclosure has been principally selected for readability and instructional purposes, and may not have been selected to delineate or circumscribe the disclosed subject matter, resort to the claims being necessary to determine such disclosed subject matter.

Figure 1:
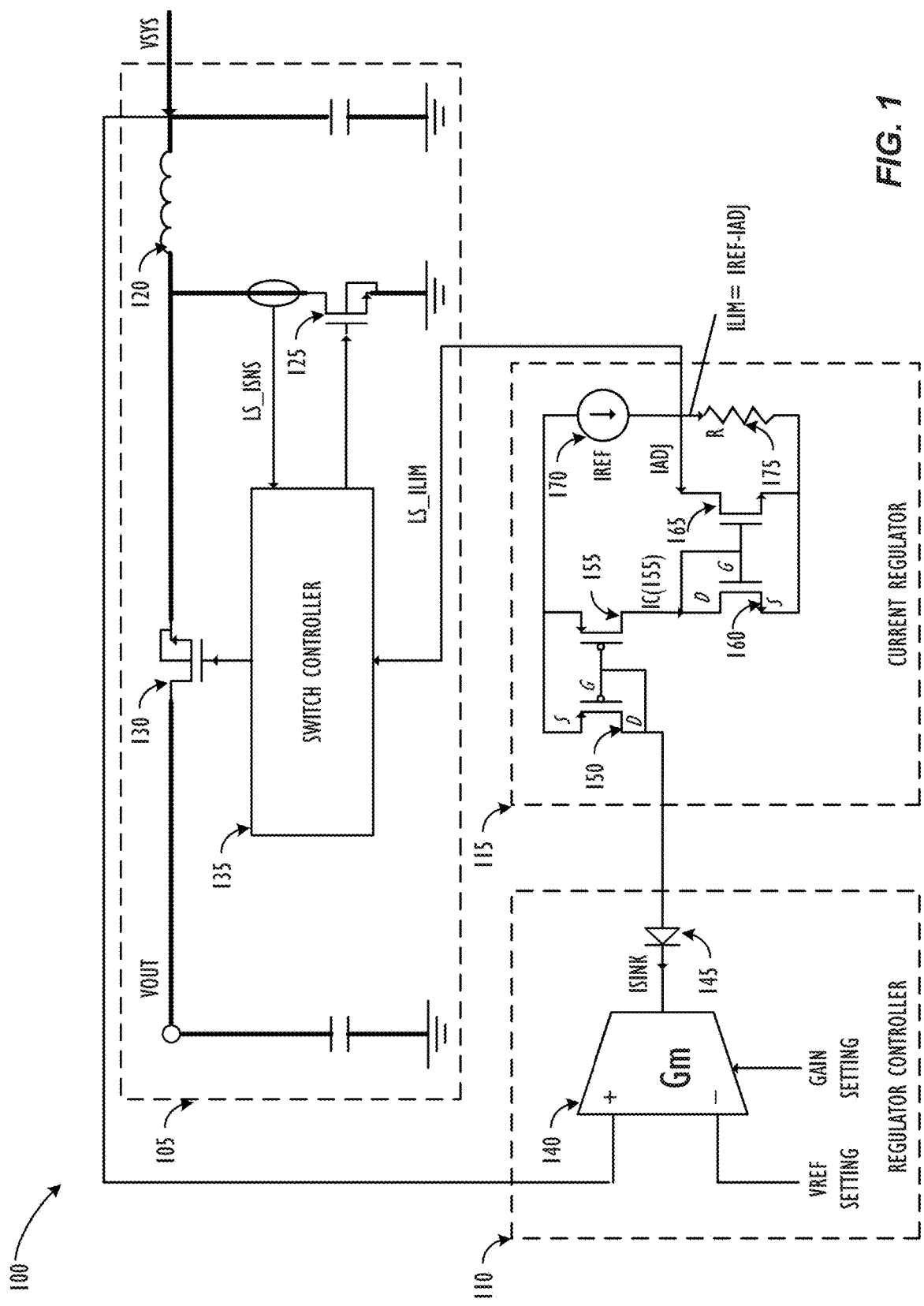
FIG. 1 shows an exemplary input power regulator system for a boost converter.

FIG. 1 shows an exemplary input power regulator system for boost converter 100. To facilitate understanding, only the portions of boost converter 100 that pertain to explanations of the disclosure is depicted in FIG. 1. In practice, boost converter 100 may comprise additional circuits and/or components, for example, for the purposes of measurement, control, communication, diagnosis, and so on. As shown in FIG. 1, boost converter 100 may include main power circuit 105, regulator controller 110, and current regulator 115. Main power circuit 105 may receive an input voltage $V_{SYS}$ at an input terminal and provide an output voltage $V_{OUT}$ at an output terminal. The input voltage $V_{SYS}$ may come from a battery's terminal voltage directly or may be supplied by the battery's terminal voltage through one or more voltage regulation circuits. (The battery is not shown in FIG. 1). Main power circuit 105 may use inductor 120 and switches 125 and 130 to step up the input voltage $V_{SYS}$ to a regulated output voltage $V_{OUT}$. For example, main power circuit 105 may turn on/off switches 125 and 130 complementarily using switch controller 135. When switch 125 is closed (and switch 130 is open), inductor 120 may be charged by the battery. Conversely, when switch 130 is closed (and switch 125 is open), the battery, together with inductor 120, may power a load, such as subsystem(s) of a mobile system with the output voltage $V_{OUT}$. As a voltage generated by inductor 120 may be added to the input voltage $V_{SYS}$ when power is delivered to the load, main power circuit 105 may produce the output voltage $V_{OUT}$ that is greater than the input voltage $V_{SYS}$. Note that main power circuit 105, regulator controller 110 and current regulator 115 may be fabricated as one single or different devices.

As mentioned above, load transients such as fast load increases at the output terminal may "drain" the power from the battery and thus cause voltage sag(s) of the input voltage $V_{SYS}$. To address the issue, switch controller 135 may be further configured to (1) receive a current limit threshold LS_ILIM from current regulator 115 and a sensed current LS_ISNS; and (2) perform cycle-by-cycle current limiting based on LS_ILIM and LS_ISNS. For example, switch controller 135 may compare LS_ILIM and LS_ISNS; and turn off switch 125 when LS_ISNS exceeds LS_ILIM. The sensed current LS_ISNS may be representative of a current flowing through switch 125 during its on-time; and the cycle-by-cycle current limiting may be applied during switch 125's on-time every one or more switching cycles.

Still referring to FIG. 1, the current limit threshold LS_ILIM may be produced by current regulator 115 based on a sink current $I_{SINK}$ provided by regulator controller 110. For example, regulator controller 110 may comprise a transconductance amplifier 140, which may produce the sink current $I_{SINK}$ based on a differential between input voltage $V_{SYS}$ of boost converter 100 and reference voltage $V_{REF}$ according to equation (1):

$$I_{SINK}=G_m \times (V_{SYS}-V_{REF}) \quad (1)$$

where Gm is a gain of transconductance amplifier 140, $V_{SYS}$ is the input voltage of boost converter 100, and $V_{REF}$ is a reference voltage of transconductance amplifier 140. Transconductance amplifier 140 may further include a diode 145 to direct the flow of $I_{SINK}$. The gain Gm of transconductance amplifier 140 may be programmable, and may be predetermined and/or adjusted during operation as a function of the input voltage $V_{SYS}$ and/or loading condition of the battery. Additionally, the reference voltage $V_{REF}$ may also be programmable, such as being predetermined and/or adjusted responsive to the type, age and/or temperature of the battery. Transconductance amplifier 140 may function as a voltage-controlled current source that may produce the sink current $I_{SINK}$, as a command signal for current regulator 115, based on the differential voltage between $V_{SYS}$ and $V_{REF}$ as shown by equation (1). As an alternative to transconductance amplifier 140, boost converter may use other types of controllers, such as a proportional controller(s), a proportional-integral controller(s), a proportional-integral-derivative controller(s), etc.

Once current regulator 115 receives the sink current $I_{SINK}$, current regulator 115 may produce a current limit threshold LS_ILIM. Current regulator 115 may comprise one or more current mirrors using transistors, for example, p-type metal oxide semiconductors (PMOS's) 150/155 and n-type metal oxide semiconductors (NMOS's) 160/165. As an alternative to metal oxide semiconductors, the current mirrors may employ other types of semiconductors and/or transistors such as bipolar junction transistor, field-effect transistors, metal oxide semiconductor field-effect transistors, and so on. The current mirrors may function as a current-controlled current source that produces an output current (e.g., $I_{ADJ}$ as shown in FIG. 1) based on an input current (e.g., $I_{SINK}$ as shown in FIG. 1). The gates (G), drains (D) and sources (S) of PMOS 150 and NMOS 160 are labeled in FIG. 1. The gates (G), drains (D) and sources (S) of PMOS 155 and NMOS 165 may be determined following the same designation, respectively.

As shown in FIG. 1, PMOS 150 may have the drain and gate connected together. This may force PMOS 150 to operate in a saturation mode such as:

$$I_D(150) = \frac{1}{2}k_1' \frac{W_1}{L_1}[V_{GS}(150) - V_t(150)]^2 \quad (2)$$

where $I_D(150)$ represents the drain current of PMOS 150, $V_{GS}(150)$ represents the gate-to-source voltage of PMOS 150, $V_t(150)$ represents the threshold voltage of PMOS 150, $k_1'$ represents a channel divider of PMOS 150, $W_1$ represents a gate width of PMOS 150, and $L_1$ represents a gate length of PMOS 150. Because the gate current of PMOS 150 is typically negligently small, the drain current of PMOS 150 may be determined according to equation (3):

$$I_D(150)=I_{SINK} \quad (3)$$

Still referring to FIG. 1, the drain current $I_D(155)$ of PMOS 155 may be determined according to equation (4):

$$I_D(155) = \frac{1}{2}k_2' \frac{W_2}{L_2}[V_{GS}(155) - V_t(155)]^2 \quad (4)$$

where $I_D(155)$ represents the drain current of PMOS 155, $V_{GS}(155)$ is the gate-to-source voltage of PMOS 155, $V_t(150)$ is the threshold voltage of PMOS 155, $k_2'$ represents a channel divider of PMOS 155, $W_2$ represents a gate width of PMOS 155, and $L_2$ represents a gate length of PMOS 155. Further, because the gate of PMOS 150 may be connected with the gate of PMOS 155, and the source of PMOS 150 may be connected with the source of PMOS 155, the two PMOS's have the same gate-to-source voltages, i.e., $V_{GS}(150)=V_{GS}(155)$. If the two PMOS's are matched with the same threshold voltages, i.e., $V_t(150)=V_t(155)$, then:

$$I_D(155) = \frac{k_2' W_2/L_2}{k_1' W_1/L_1} I_D(150) = N_1 I_{SINK} \quad (5)$$

where $N_1$ represents a ratio between sink current $I_{SINK}$ and drain current $I_D(155)$ of PMOS 155.

Following the same analysis, because the gate of NMOS 160 may be connected with the gate of NMOS 165, and the source of NMOS 160 may be connected with the source of NMOS 165, the two NMOS's have the same gate-to-source voltages, i.e., $V_{GS}(160)=V_{GS}(165)$. If the two NMOS's are perfectly matched with the same threshold voltages, i.e., $V_t(160)=V_t(165)$, the drain current $I_{ADJ}$ of NMOS 165 may be determined according to equation (6):

$$I_{ADJ}=I_D(165)=N_2 I_D(155)=N_2 N_1 I_{SINK}=NI_{SINK} \quad (6)$$

where $N_2$ represents a ratio between drain current $I_{ADJ}$ of NMOS 165 and drain current $I_D(155)$ of PMOS 155, which is determined by the parameters of NMOS's 160 and 165; and N represents a ratio between the drain current $I_{ADJ}$ of NMOS 165 and the sink current $I_{SINK}$. It may be noted that with the current mirrors formed by PMOS's 150/155 and NMOS's 160/165, current regulator 115 may produce an output current $I_{ADJ}$ based on the input current $I_{SINK}$.

Current regulator 115 may further comprise current source 170 and resistor 175. Current source 170 may provide an additional reference current $I_{REF}$ that, when passed through resistor 175, results in a voltage LS_ILIM (i.e., the current limit threshold) according to equation (7):

$$LS\_ILIM=R\times(I_{REF}-I_{ADJ})=R\times(I_{REF}-NI_{SINK}) \quad (7)$$

where R is the resistance of resistor 175, $I_{REF}$ is the reference current provided by current source 170, and LS_ILIM is the voltage across resistor 175. It may be noted boost converter 100 may (1) employ regulator controller 110 and current regulator 115 to monitor boost converter 100's input voltage $V_{SYS}$ and generate LS_ILIM; and (2) accordingly perform cycle-by-cycle current limiting to main power circuit 105 to regulate (i.e., limit) boost converter 100's input power. Note that regulator controller 110 and current regulator 115 may be hardware implemented, as shown here, to achieve quick response with low latency. However, software/firmware based implementations could also be used if appropriate in certain systems.

Figure 2:
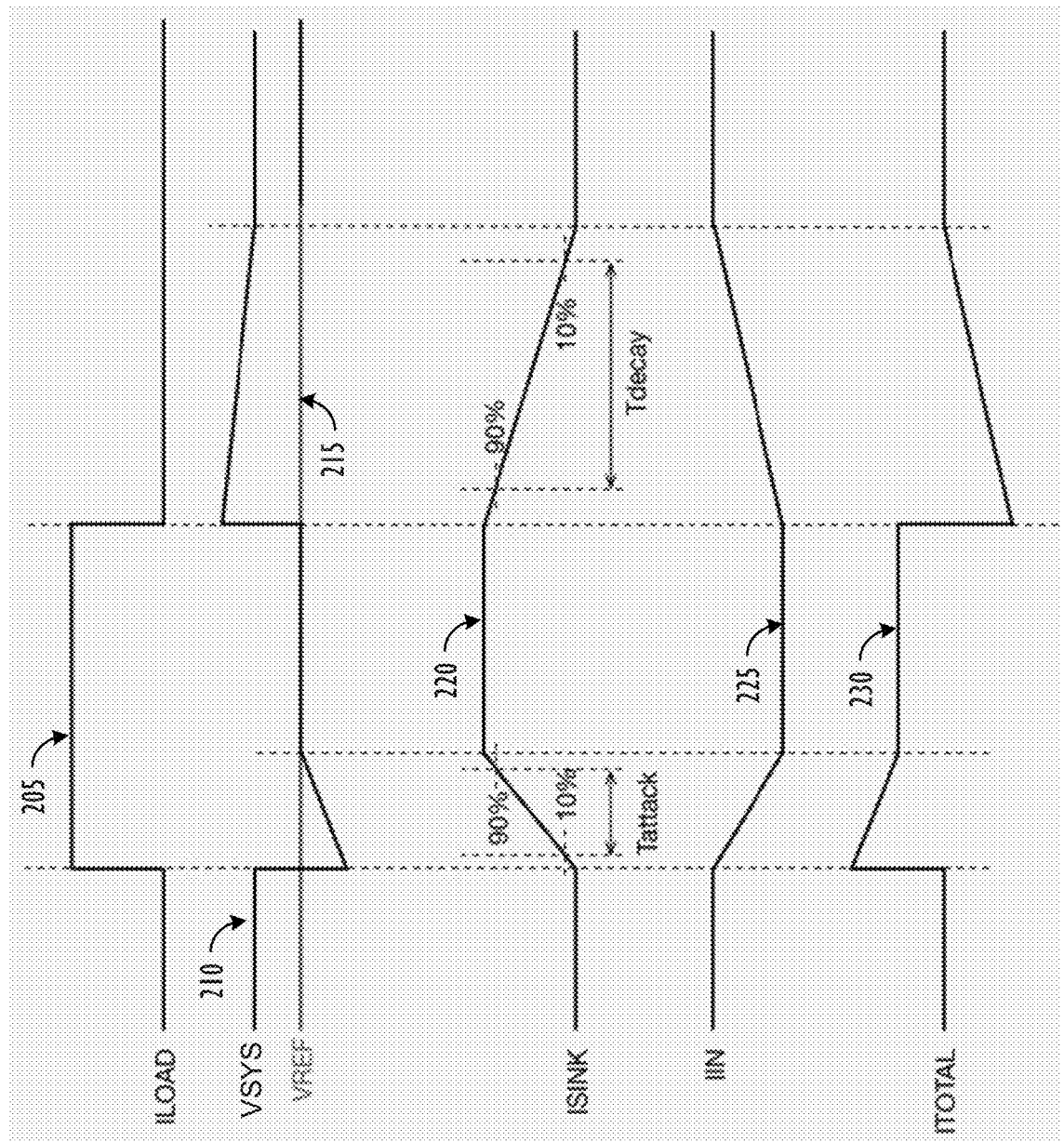
FIG. 2 shows exemplary waveforms of a power converter.

FIG. 2 shows exemplary waveforms of boost converter 100 during load variations. As shown in FIG. 2, waveform 205 may represent the waveform of load current $I_{LOAD}$ that is provided by boost converter 100 to a load, for example, a current flowing through switch 130 of boost converter 100 in FIG. 1. In case of a sudden load increase, as shown by an increase of $I_{LOAD}$ in waveform 205, input voltage $V_{SYS}$ in waveform 210 may have a voltage sag. As described above, it may be desired for boost converter 100 to have a quick response with low latency to limit the input power of boost converter drawn from a power-limited resource. Therefore, after input voltage $V_{SYS}$ falls below a reference voltage $V_{REF}$ that is illustrated by waveform 215, regulator controller 110 of boost converter 100 may become active, producing the sink current $I_{SINK}$ quickly as shown by waveform 220 to restore the input voltage $V_{SYS}$. As described in FIG. 1, consequently current regulator 115 of boost converter 100 may create an input current $I_{IN}$, such as a current flowing through switch 125 of boost converter 100, shown in waveform 225. As a result, the current drawn by boost converter 100 from the power-limited source $I_{TOTAL}$ (e.g., a current flowing through inductor 120 of boost converter 100) may equal the sum of load current $I_{LOAD}$ and input current $I_{IN}$ (i.e., $I_{TOTAL}=I_{LOAD}+I_{IN}$), as illustrated by waveform 230. Finally, when the load increase disappears, as shown by a reduction of $I_{LOAD}$ in waveform 205, the sink current $I_{SINK}$ and input current $I_{IN}$ may be reduced (shown in waveforms 220 and 225 respectively), and the input voltage $V_{SYS}$ (in waveform 210) may be recovered accordingly. Note that durations $T_{ATTACK}$ and $T_{DECAY}$, corresponding to variations of $I_{SINK}$ between 10% and 90% values during the sag and recovery of $V_{SYS}$, illustrates that boost converter 100 may optionally take a longer time to release than activate the input power regulation. This may be used to reduce oscillations and improve transient performance when boost converter 100 leaves the current limiting operation.

Figure 3:
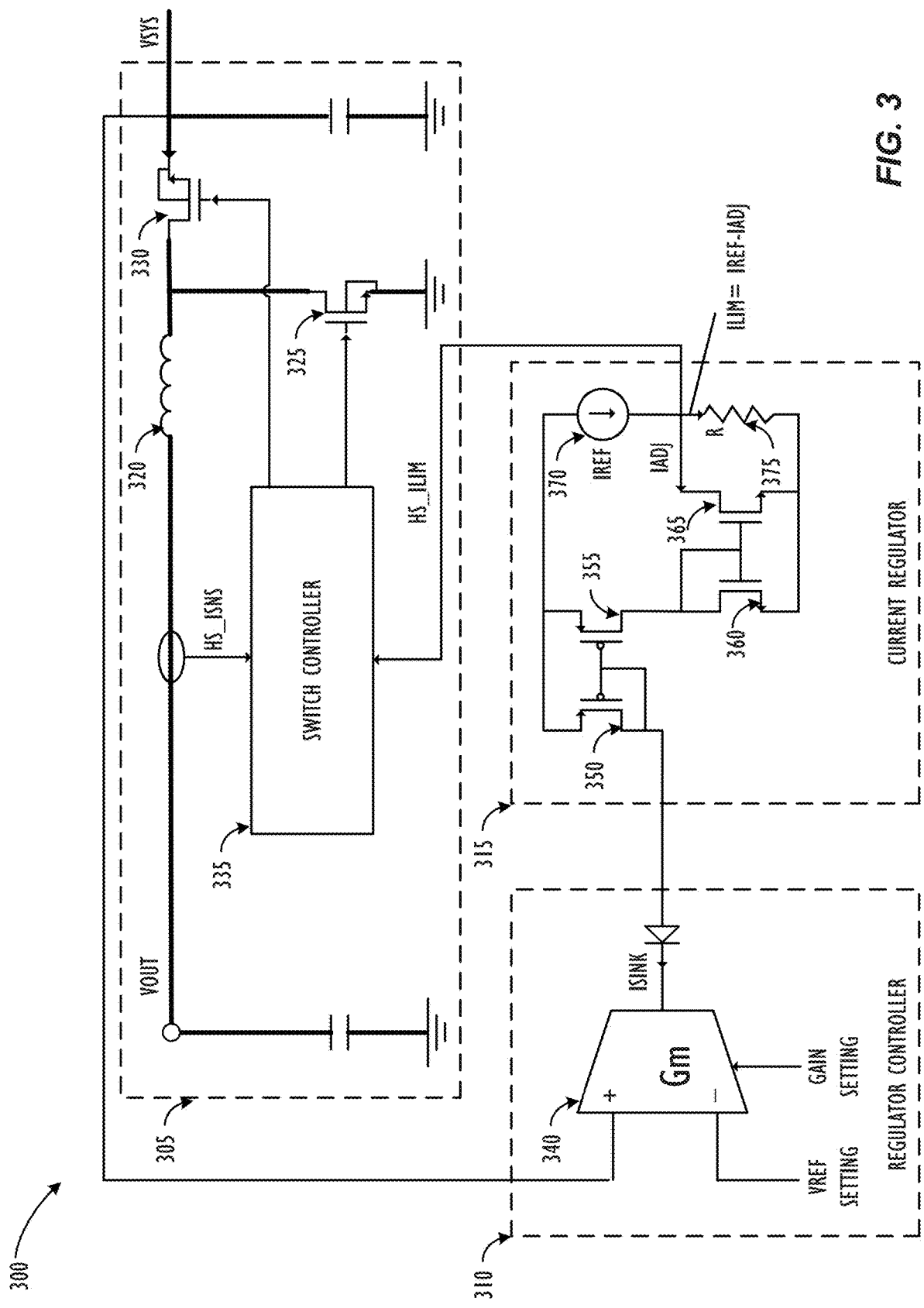
FIG. 3 shows an exemplary input power regulator system for a buck converter.

The input power regulation as described for boost converter 100 may also apply to other types of power converters. FIG. 3 shows an exemplary input power regulator system for buck converter 300. As shown herein, buck converter 300 may comprise main power circuit 305, regulator controller 310 and current regulator 315. Certain differences between boost converter 100 (as shown in FIG. 1) and buck converter 300 (as shown in FIG. 3) may be noted. For example, inductor 320 of main power circuit 305 may be coupled between switches 330 and 335, rather than between switch 325 and the input terminal. Because of the different main power circuit configurations, buck converter 300 may produce an output voltage $V_{OUT}$ that is less than an input voltage $V_{SYS}$. Additionally, the sensed current HS_ISNS may represent a current flowing through switch 330, rather than through switch 325.

Despite those differences, the input power regulating of buck converter 300 may operate in substantially the same way as discussed above with respect to boost converter 100. Regulator controller 310 may (1) receive the input voltage $V_{SYS}$ of buck converter 300; (2) and produce a sink current $I_{SINK}$, as a command signal for current regulator 315, based on a differential voltage between $V_{SYS}$ and a reference voltage $V_{REF}$ with transconductance amplifier 340. Accordingly, current regulator 315 may employ one or more current mirrors (e.g., formed by PMOS's 350/355 and NMOS's 360/365), current source 370 and resistor 375 to produce a current limit threshold HS_ILIM as a voltage signal for switch controller 335. Finally, main power circuit 305 may perform cycle-by-cycle current limiting based on the sensed current HS_ISNS and a current limit threshold HS_ILIM to regulate the input power drawn by buck converter 300 from a battery.

The various embodiments described above are provided by way of illustration only and should not be constructed to limit the scope of the disclosure. Various modifications and changes can be made to the principles and embodiments herein without departing from the scope of the disclosure and without departing from the scope of the claims.

The invention claimed is:

1. A power converter, comprising:
a main power circuit configured to produce an output voltage from a battery;
a regulator controller configured to produce a command signal based on the input voltage and a reference voltage, wherein the reference voltage is adjustable based on one or more of an age or a temperature of the battery and wherein the reference voltage is adjusted so as to limit voltage sag of the input voltage; and
a current regulator configured to produce a current limit threshold based on the command signal,
wherein the main power circuit is configured to limit an input power received from the power-limited input voltage source based on the adjusted current limit threshold.

2. The power converter of claim 1, wherein the regulator controller comprises a transconductance amplifier configured to produce the command signal as a sink current based on the input voltage and the reference voltage.

3. The power converter of claim 1, wherein the main power circuit is further configured to limit the input power on a cycle-by-cycle basis.

4. The power converter of claim 1, wherein the main power circuit comprises a boost converter.

5. The power converter of claim 1, wherein the main power circuit comprises a buck converter.

6. The power converter of claim 1, wherein the reference voltage is adjustable based on an age of the power-limited input voltage source.

7. The power converter of claim 2, wherein the current regulator comprises a current mirror configured to produce the current limit threshold based on the sink current.

8. The power converter of claim 2, wherein the transconductance amplifier has an adjustable gain that is adjusted based on the input voltage of the power converter.

9. The power converter of claim 6, wherein the reference voltage is adjustable based on an age and a temperature of the power-limited input voltage source.

10. The power converter of claim 7, wherein the current mirror comprises one or more transistors.

11. A method for limiting an input power of a battery-powered power converter, the method comprising:
using a throttle controller to provide a command signal based on an input voltage of the power converter and a reference voltage, wherein the reference voltage is adjustable based on at least one of an age or a temperature of the battery and is adjusted so as to limit voltage sag of the input voltage;
using a current regulator to provide an adjusted current limit threshold based on the command signal; and
limiting an input power of the power converter based on the adjusted current limit threshold.

12. The method of claim 11, wherein the throttle controller comprises a transconductance amplifier.

13. The method of claim 11, wherein limiting the input power of the power converter comprises performing cycle-by-cycle current limiting based on the current limit threshold.

14. The method of claim 11, wherein the power converter comprises a buck converter.

15. The method of claim 11, wherein the power converter comprises a boost converter.

16. The method of claim 11, wherein the reference voltage is adjustable based on an age of the power-limited source.

17. The method of claim 12, wherein the current regulator comprises a current mirror.

18. The method of claim 12, wherein the transconductance amplifier is configured to have an adjustable gain based on the input voltage of the power converter.

19. The method of claim 16, wherein the reference voltage is adjustable based on an age and a temperature of the power-limited source.

20. The method of claim 17, wherein the current mirror comprises one or more transistors.

21. A power converter comprising:
   an input configured to receive an input voltage from a battery;
   an inductor and a plurality of switching devices coupled between the input and an output of the power converter;
   a switch controller coupled to the plurality of switching devices and configured to operate the switching devices to produce an output voltage from the input voltage; and
   a current limiting circuit having a current regulator and a regulator controller, the current limiting circuit being coupled to the switch controller and configured to limit input power by causing the switch controller to modify operation of one or more of the plurality of switching devices responsive to a comparison between the input voltage and a reference voltage, wherein the reference voltage is adjustable based on one or more of an age or a temperature of the battery and wherein the reference voltage is adjusted so as to limit voltage sag of the input voltage.

22. The power converter of claim 21, wherein the reference voltage is adjustable based on an age of the power-limited input voltage source.

23. The power converter of claim 22, wherein the reference voltage is adjustable based on an age and a temperature of the power-limited input voltage source.

* * * * *